(12) United States Patent
James

(10) Patent No.: US 9,069,919 B1
(45) Date of Patent: Jun. 30, 2015

(54) METHOD AND SYSTEM FOR ARBITRATION VERIFICATION

(71) Applicant: QLOGIC, Corporation, Aliso Viejo, CA (US)

(72) Inventor: Philip P. James, Bangalore (IN)

(73) Assignee: QLOGIC, Corporation, Aliso Viejo, CA (US)

( * ) Notice: Subject to any disclaimer, the term of this patent is extended or adjusted under 35 U.S.C. 154(b) by 321 days.

(21) Appl. No.: 13/654,308

(22) Filed: Oct. 17, 2012

(51) Int. Cl.
*G06F 17/50* (2006.01)
*G06F 13/14* (2006.01)
*G06F 13/364* (2006.01)
*G06F 13/36* (2006.01)

(52) U.S. Cl.
CPC ............ *G06F 17/5036* (2013.01); *G06F 13/36* (2013.01); *G06F 13/364* (2013.01)

(58) Field of Classification Search
CPC .... G06F 17/5036; G06F 13/36; G06F 13/364
USPC .......... 716/136; 710/100, 105, 107, 109, 111, 710/112, 305, 307, 309, 314
See application file for complete search history.

(56) References Cited

U.S. PATENT DOCUMENTS

| | | | |
|---|---|---|---|
| 4,825,438 A * | 4/1989 | Bennett et al. .................. 714/56 |
| 6,073,194 A * | 6/2000 | Lowe ............................. 710/100 |
| 6,173,243 B1 * | 1/2001 | Lowe et al. ...................... 703/14 |
| 6,460,174 B1 * | 10/2002 | Carey ............................. 716/104 |
| 6,473,871 B1 * | 10/2002 | Coyle et al. ..................... 714/715 |
| 6,574,778 B2 * | 6/2003 | Chang et al. ................... 716/102 |
| 6,634,016 B1 * | 10/2003 | Farooq ............................ 716/117 |
| 6,763,415 B1 * | 7/2004 | Tischler ......................... 710/240 |
| 6,941,256 B1 * | 9/2005 | Fujiwara ......................... 703/15 |
| 6,966,018 B2 * | 11/2005 | Hilliges ......................... 714/724 |
| 7,684,431 B1 * | 3/2010 | Gibson .......................... 370/461 |
| 7,739,436 B2 * | 6/2010 | Meyer ............................ 710/111 |
| 8,190,804 B1 * | 5/2012 | Srinivasan et al. ............. 710/244 |
| 8,381,148 B1 * | 2/2013 | Loh et al. ....................... 716/106 |
| 8,484,397 B1 * | 7/2013 | Srinivasan et al. ............. 710/244 |
| 2002/0070725 A1 * | 6/2002 | Hilliges ....................... 324/158.1 |
| 2003/0076723 A1 * | 4/2003 | Zarrineh et al. ............... 365/201 |
| 2003/0126314 A1 * | 7/2003 | Litt .................................. 710/1 |
| 2005/0004777 A1 * | 1/2005 | Houlihane .................... 702/119 |
| 2006/0048085 A1 * | 3/2006 | Tyler et al. ......................... 716/6 |
| 2006/0167784 A1 * | 7/2006 | Hoffberg ......................... 705/37 |
| 2007/0271405 A1 * | 11/2007 | Moore ............................ 710/309 |
| 2007/0277130 A1 * | 11/2007 | Lavelle ............................. 716/4 |
| 2009/0271165 A1 * | 10/2009 | Averill et al. ..................... 703/13 |
| 2010/0095255 A1 * | 4/2010 | Thompson et al. ............... 716/5 |
| 2011/0040920 A1 * | 2/2011 | Chou et al. .................... 710/316 |

* cited by examiner

*Primary Examiner* — Stacy Whitmore
(74) *Attorney, Agent, or Firm* — Klein, O'Neill & Singh, LLP

(57) ABSTRACT

A method for providing port arbitration verification for a design under test (DUT) is provided. The method includes sampling the availability of ports at a predetermined number of clock cycles prior to an arbitration point. The method predicts a winner at each of the clock cycles and determines a verification result based on a match between one of the predicted winners and an actual arbitration winner for the DUT.

17 Claims, 12 Drawing Sheets

METHOD AND SYSTEM FOR ARBITRATION VERIFICATION

BACKGROUND

1. Technical Field

The present invention relates generally to data verification in a computer system, and more particularly to a system and method for verifying port arbitration.

2. Related Art

Arbitration is used in computing devices for selecting between requests for a resource. Arbitration logic is typically used in computing devices to select a winner from multiple contenders based on a set of rules. The rules may be a round robin type or more complex variations such as deficit weighted round robin. For example, an adapter that is coupled to a network may have multiple ports. Frames may arrive at the ports at different times. Arbitration logic may be used to select a frame for further processing.

Simulation is also commonly used to verify designs for computing devices, including application specific integrated circuits (ASICs). The asynchronous nature of requests inside a computing device and uncertainty with respect to delays in a network device from the time a request is generated to the time of an arbitration outcome makes it difficult to verify an arbitration scheme. Continuous efforts are being made to efficiently verify arbitration logic used in computing devices and systems.

SUMMARY

In some aspects, the disclosure provides a method for providing arbitration verification, the method comprising: sampling port availability information for a plurality of ports at at least one clock cycle in advance of an arbitration point; determining a predicted arbitration winner for each of the at least one clock cycle in advance of the arbitration point; comparing each predicted arbitration winner to an actual arbitration winner selected by a design under test at the arbitration point; and determining a verification fail unless the arbitration winner matches at least one predicted arbitration winner.

In some aspects, the disclosure provides a method for providing arbitration verification, the method comprising: sampling port availability information for a plurality of ports at at least one clock cycle in advance of an arbitration point; determining a predicted arbitration winner for each of the at least one clock cycle in advance of the arbitration point; comparing each predicted arbitration winner to an actual arbitration winner selected by a design under test at the arbitration point; and updating a reference model based on a matching predicted arbitration winner when the actual arbitration winner matches a predicted arbitration winner.

In another aspect, a system for providing arbitration verification is provided. The system includes an arbitration verification system executed by a computing system for verifying arbitration used by a design under test; wherein the arbitration verification system is configured to sample port availability information for a plurality of ports of the design under test at a plurality of clock cycles in advance of an arbitration point; determine a predicted arbitration winner for each of the plurality of clock cycles in advance of the arbitration point; compare each predicted arbitration winner to an actual arbitration winner selected by the design under test at the arbitration point; and determine a verification fail unless the arbitration winner matches at least one predicted arbitration winner.

This brief summary has been provided so that the nature of the disclosure may be quickly understood. A more complete understanding of the disclosure can be obtained by reference to the following detailed description of the various embodiments thereof concerning the attached drawings.

BRIEF DESCRIPTION OF THE DRAWINGS

The foregoing features and other features of the disclosure will now be described with reference to the drawings of the various embodiments. In the drawings, the same components have the same reference numerals. The illustrated embodiments are intended to illustrate, but not to limit the disclosure. The drawings include the following figures.

DETAILED DESCRIPTION

To facilitate an understanding of the various embodiments, the general architecture and operation of a computing system is first described. The specific architecture and operation for the various embodiments will then be described with reference to the general architecture.

As a preliminary note, as used in this disclosure, the terms "component", "module", system" and the like are intended to refer to a computer-related entity, either software-executing general purpose processor, hardware, firmware and a combination thereof. For example, a component may be, but is not limited to being, a process running on a processor, a processor, an object, an executable, a thread of execution, a program, and/or a computer.

By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

Computer executable components can be stored, for example, on non-transitory computer readable media including but not limited to, an ASIC (application specific integrated circuit), CD (compact disc), DVD (digital video disk), ROM (read only memory), floppy disk, hard disk, EEPROM (electrically erasable programmable read only memory), memory stick flash drive, or any other storage device type, in accordance with the claimed subject matter.

Figure 1A:
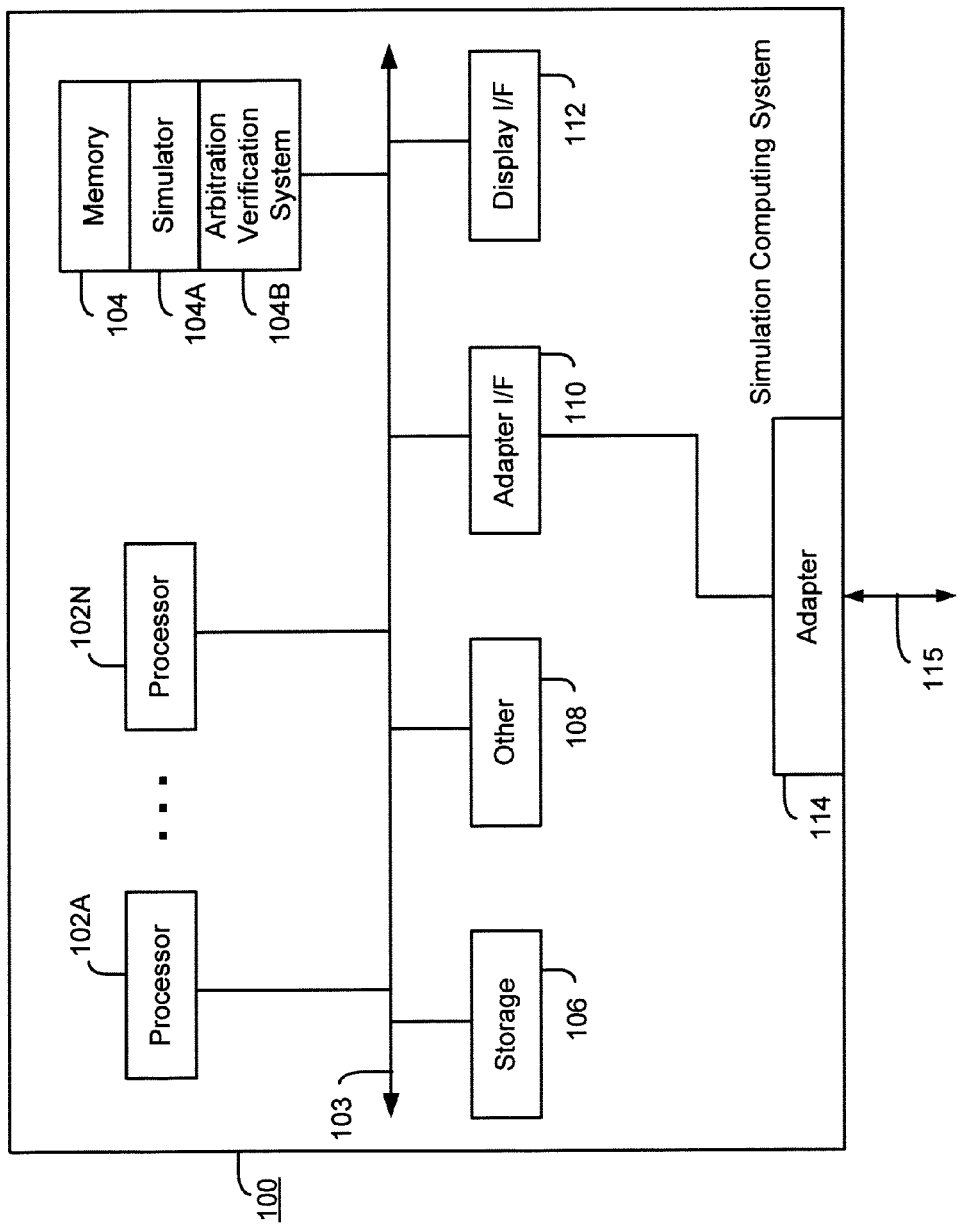
FIG. 1A is a block diagram illustrating a generic computing system used for simulation with a simulator and arbitration verification system in accordance with an embodiment.

FIG. 1A is a block diagram illustrating a generic computing system used for simulation with a simulator and arbitration verification system in accordance with an embodiment. Referring to FIG. 1A, the computing system 100 may include processors 102A-N (may be referred to as processor 102 or processors 102) which interface with an interconnect 103 (may also be referred to as bus 103). Processors 102 may be, or may include, one or more programmable general-purpose or special-purpose microprocessors, digital signal processors (DSPs), programmable controllers, application specific integrated circuits (ASICs), programmable logic devices (PLDs), or the like, or a combination of such hardware devices.

Bus 103 may be, for example, a system bus, a Peripheral Component Interconnect (PCI) bus (or PCI Express bus), a HyperTransport or industry standard architecture (ISA) bus, a SCSI bus, a universal serial bus (USB), an Institute of Electrical and Electronics Engineers (IEEE) standard 1394 bus (sometimes referred to as "Firewire"), or any other type of interconnect.

The computing system 100 may also include a storage device 106, which may include, for example, a hard disk, a CD-ROM, a non-volatile memory device (e.g., flash or memory stick) or any other type of storage device. Storage device 106 may store processor executable instructions and data, for example, operating system program files, application program files, and other files. For example, the processors 102 may, independently or in combination, execute computer-executable process steps of an application program so that processors 102 may properly execute the application program.

In some embodiments, the processor executable instructions and data may be stored using an installation program. For example, a processor 102A may execute computer-executable instructions of an installation program so that the processor 102A may properly execute the application.

The computing system 100 may also include a memory (e.g., random access memory (RAM)) 104 that interfaces with the bus 103 to provide the processors 102 with access to memory storage. When executing stored computer-executable process steps from the storage device 106, the processors 102 may store and execute the process steps out of the memory 104. Memory 104 may also be utilized to store a simulator program 104A and arbitration verification system 104B. Simulator program 104A may be used to perform data simulations, for example, to emulate data input/output operations of a device in a network system, as described below in detail.

The arbitration verification system 104B may be used to perform tests to determine whether a chosen arbitration protocol is being properly implemented in a given system or device referred to as a design under test (DUT). A DUT may refer to a manufactured product such as an ASIC which is subjected to testing procedures to confirm proper operation.

The computing system 100 also includes other devices 108, which may include, for example, input-output devices (e.g., keyboard, mouse and others), video graphics and/or sound generation hardware. Details of the other devices 108 are not germane to the embodiments disclosed herein.

The computing system 100 may further include a network adapter 114 (may be referred to as a network device) that is coupled to bus 108 via an adapter interface 110 and then to other components of the computing system 100. The network adapter 114 may be connected to other systems and/or other network devices via interconnect 115. The network adapter 114 may be adapted to one or more of a wide variety of networks, including local area networks, storage area networks, wide area networks, server networks, the Internet, and the like. The adapter 114 may be configured to handle both network and storage traffic communications with network devices and storage systems (not shown), for example.

Adapter 114 may use various network and storage protocols to handle network and storage traffic. Some common protocols are described below.

One common network protocol is Ethernet. The original Ethernet bus or star topology was developed for local area networks (LAN) to transfer data at 10 Mbps (mega bits per second). Newer Ethernet standards (for example, Fast Ethernet (100 Base-T) and Gigabit Ethernet) support data transfer rates between 100 Mbps and 10 gigabit (Gb). The adaptive embodiments disclosed herein are not limited to any particular protocol, as long as the functional goals are met by an existing or new network protocol.

One common storage protocol used to access storage systems is Fibre Channel. Fibre channel is a set of American National Standards Institute (ANSI) standards that provide a serial transmission protocol for storage and network protocols such as HIPPI, SCSI, IP, ATM and others. Fibre channel supports three different topologies: point-to-point, arbitrated loop and fabric. The point-to-point topology attaches two devices directly. The arbitrated loop topology attaches devices in a loop. The fabric topology attaches host systems directly (via HBAs) to a fabric, which are then connected to multiple devices. The Fibre Channel fabric topology allows several media types to be interconnected. Fibre Channel fabric devices include a node port or "N_Port" that manages Fabric connections. The N_port establishes a connection to a Fabric element (e.g., a switch) having a fabric port or F_port.

A new and upcoming standard, called Fibre Channel over Ethernet (FCOE) has been developed to handle both Ethernet and Fibre Channel traffic in a storage area network (SAN). This functionality would allow Fibre Channel to leverage 10 Gigabit Ethernet networks while preserving the Fibre Channel protocol. The adapter 114 shown in FIG. 1A may be configured to operate as a FCOE adapter and may be referred to as FCOE adapter 114. QLogic Corporation, the assignee of the present application, provides one such adapter. Those of ordinary skill in the art will appreciate, however, that the present embodiments are not limited to any particular protocol. The illustrated adapter 114 is merely one example of a converged network adapter that may leverage the advantages of the present embodiments.

Figure 1B:
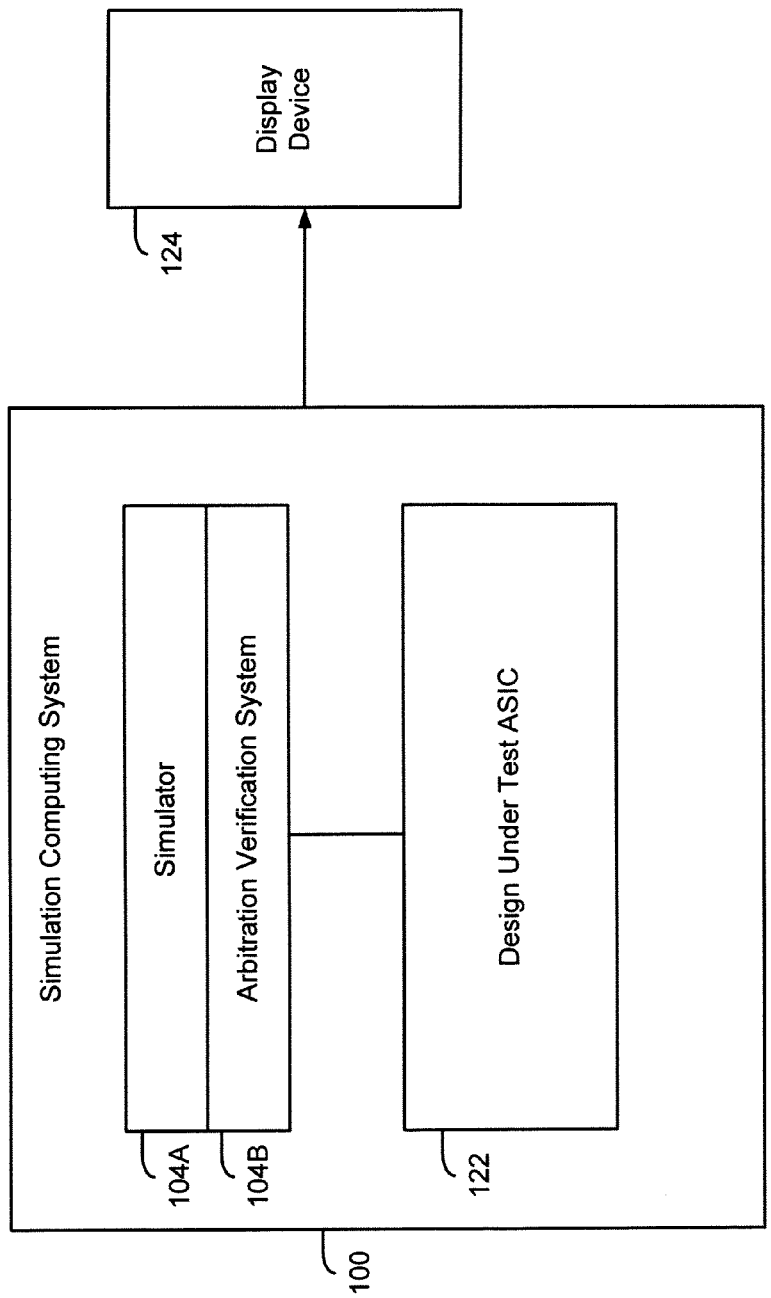
FIG. 1B is an exemplary block diagram illustrating the simulation computing system in communication with a display device in accordance with an embodiment.

FIG. 1B shows a block diagram illustrating the simulation computing system 100 in communication with a display device 124 in accordance with an embodiment. The simulation computing system 100 may interface or include a DUT 122 which in some embodiments may comprise an ASIC such as a host bus adapter, a network adapter, a converged adapter and others.

As described above with respect to FIG. 1A, simulation computing system 100 may include the simulator 104A and the arbitration verification system 104B. In some embodiments, simulator 104A may be used to simulate the performance of DUT 122 that interfaces with the computing system 100. For example, simulator 104A may be executed by processors 102 to generate test data which may be received by the DUT 122 from the computing system 100. In some embodiments, the generated test data may comprise network traffic, such as Ethernet traffic, Fibre Channel traffic or both. The test data may be provided to the DUT 122 and the arbitration verification system 104B for verifying the arbitration logic used by the DUT 122 as described below.

The arbitration verification system 104B may be used to test whether a selected arbitration process/protocol is functioning properly for DUT 122. The arbitration protocol may be used for selecting a request from among a plurality of requests at any given time and described below in detail. In some embodiments, the arbitration protocol may be a simple priority protocol, a round robin, deficit weighted round robin protocol or any other arbitration protocol. The embodiments disclosed herein are not limited to any particular protocol type.

In addition, the arbitration verification system 104B may also utilize the test data to predict an arbitration winner at timing intervals prior to the point of arbitration, as described below. For example, the arbitration verification system 104B may predict, at each of the time intervals prior to the point of arbitration, an arbitration winner using the selected arbitration protocol. In some embodiments, the arbitration verification system 104B may determine the predicted arbitration winners concurrently with the processing of the DUT 122 to determine the arbitration winner.

The arbitration verification system 104B may compare the arbitration winner determined by the DUT 122 with the predicted arbitration winners prior to the point of arbitration. If the arbitration winner determined by the DUT 122 matches any of the predicted winners, the arbitration verification system may declare that the DUT 122 has passed the arbitration verification. On the other hand if arbitration winner determined by the DUT 122 does not match any of the predicted winners, the arbitration verification system may declare that the DUT 122 has failed the arbitration verification.

Display device 124 may also be coupled to the simulation computing system 100 to display information regarding the generated test data, arbitration verification, results thereof and other information.

Figure 1C:
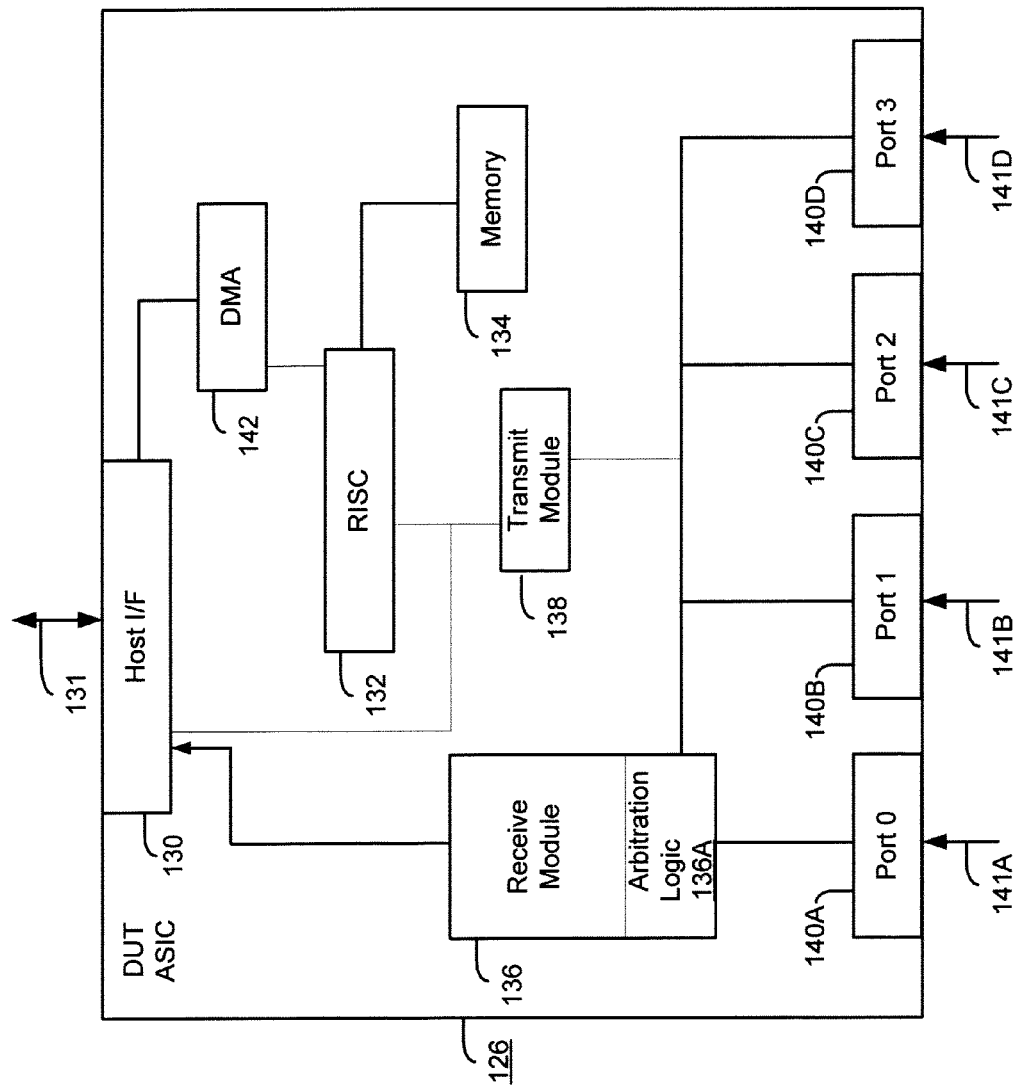
FIG. 1C is an exemplary block diagram illustrating an adapter as a design under test in accordance with an embodiment.

FIG. 1C is an exemplary block diagram illustrating an adapter 126 used in accordance with an embodiment. In some embodiments, adapter 126 may be or may be a part of the DUT 122 shown in FIG. 1B. Referring to FIG. 1C, adapter 126 includes a processor 132 that may execute firmware instructions out of memory 134 for controlling overall functionality of adapter 126. Although one processor 132 is shown, this is exemplary only, and the adapter 126 may be configured with additional processors to improve processing efficiency and according to design preference. Processor 132 may be a reduced instruction set computer (RISC) processor or any other hardware based processing device.

In one embodiment, adapter 126 includes a host interface 130 that interfaces with a computing system 100 via an interconnect 131. The structure and design of interface 130 depends on the type of interconnect. For example, if interconnect 131 is a PCI-Express link, then host interface 130 includes logic and circuitry to handle PCI-Express based traffic. The embodiments herein are not limited to any particular interconnect type.

In one embodiment, adapter 126 includes a transmit module 138 for handling transmit traffic from adapter 126. The transmit traffic is sent by computing system 100 to other devices/systems. Transmit module 138 may include memory buffers (not shown) for storing transmit packets before they are transmitted.

Adapter 126 also includes a receive module 136 that processes network information received from via a plurality of ports ((port 0, port1, port2 and port3) 140A-140D that are connected to other devices or ports. Ports 140A-140D receive information via links 141A-141D which may be configured in accordance with a network protocol such as Ethernet, Fibre Channel or FCoE as described above. Receive module 136 may also include memory buffers for temporarily storing network information that is received via ports 141A-141D, before the information is sent to computing system 100.

Adapter 126 may also include a direct memory access (DMA) module 142 which may be used for handling data transfers and other data transactions using link 131.

Various logic in the transmit module 138 and receive module 136 are used to process information received from a computing system or ports 140A-140D. The logic may perform arbitration to select certain packets or requests. For example, when packets are being received at ports 140A-140D, arbitration logic 136A in receive module 136 may have to arbitrate between various ports for selecting frames for further processing. Because frames arrive at different durations or unpredictable intervals, it is difficult to simulate arbitration logic 136A or any other module that faces similar challenges. The embodiments described herein provide an efficient systems and processes for verifying such arbitration logic, as described below in detail.

Figure 1D:
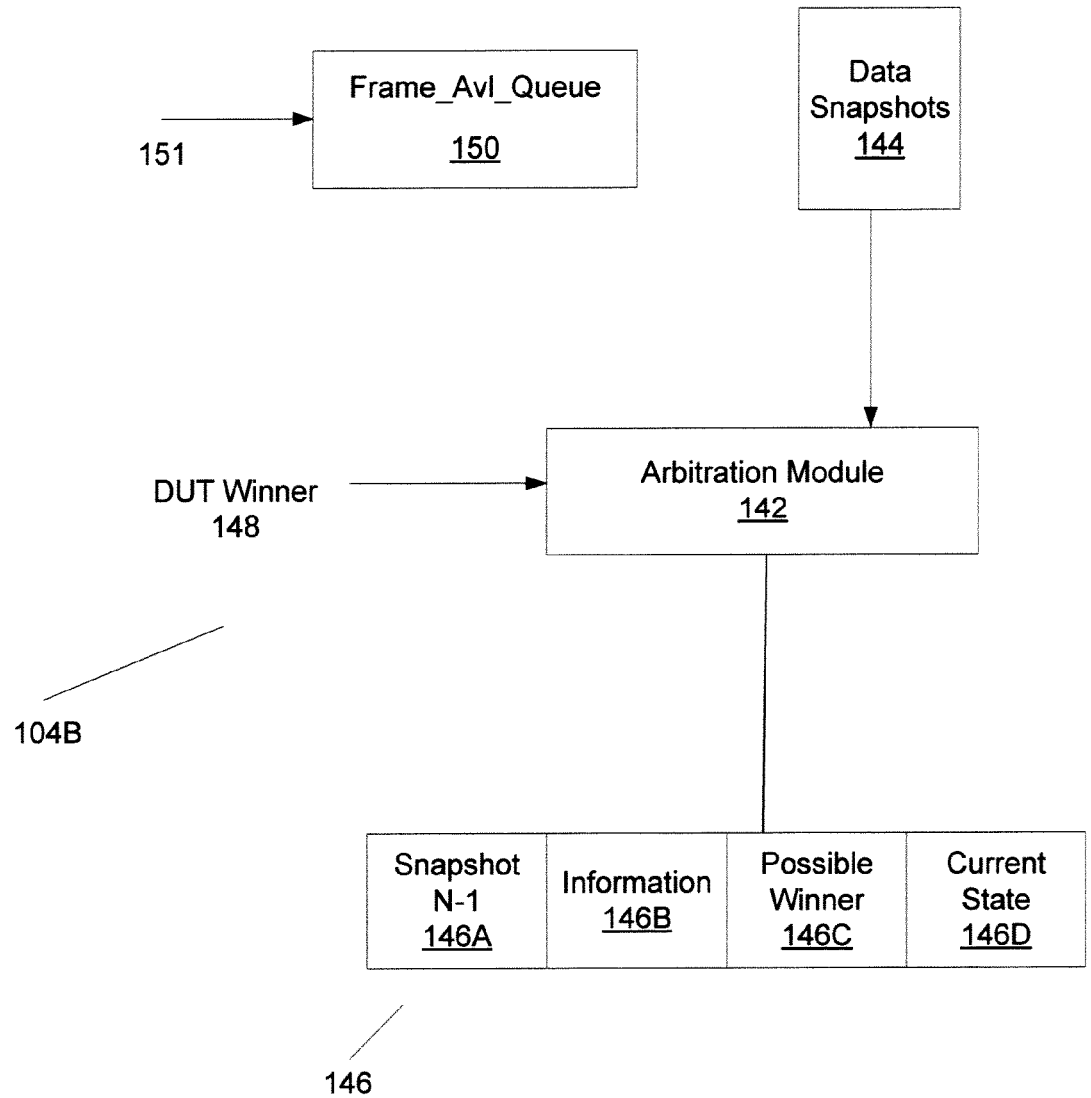
FIG. 1D shows a block diagram of the arbitration verification system, according to one embodiment.

FIG. 1D shows a block diagram for arbitration verification system 104B that may be used to verify the arbitration logic 136A, according to one embodiment. Arbitration verification system 104B includes a monitoring module 152 that monitors a frame available queue (also referred to as "frame_avl_queue) 150. The frame_avl_queue 150 may be a first-in-first-out (FIFO) based memory storage system that is used for temporarily storing certain number of entries (for example, N) corresponding to frames that have been received by adapter 126 (or DUT 122, used interchangeably). Each entry in the queue may use a self-decrementing timer (not shown) that is used to remove "old" entries from the queue after certain number of cycles, for example, M cycles.

Monitoring module 152 may take snapshots 144 corresponding to the entries stored at frame_avl_queue 150. The snapshots 144 are described below in detail with respect to FIG. 3A-3B. The snapshots are typically taken prior to an "actual" arbitration cycle. The snapshots 144 are sent to the arbitration module 142 that executes an arbitration process similar to the process that is used by the arbitration logic 136A.

The arbitration module 142 predicts possible winners and the information regarding the possible winners is stored in a state queue (may also be referred to as state_queue) 146 that stores a plurality of entries. For example, the state_queue 146 includes a field 146A that identifies the cycle of when a snapshot was taken. For example, if the arbitration were to take place in the Nth cycle, then the snapshot may be taken at the N−1 cycle, as shown in FIG. 1D. The state_queue 146 stores information regarding a plurality of ports that may have frames waiting at a given cycle, for example, N−1. The possible winner 146C identifies a possible winner at the N−1 cycle and the current state of the possible winner is identified by 146D. In one embodiment, state_queue 146 includes N number of entries and an index of an entry is the position of that entry within the state_queue 146. The use of the index is described below in detail.

When an actual DUT winner is identified, the state_queue 146 is checked to determine if the actual winner matches one of the predicted winners. The DUT winner 148 state is then updated from the state_queue 146 and then provided to arbitration module 142 for a next arbitration cycle.

Figure 2:
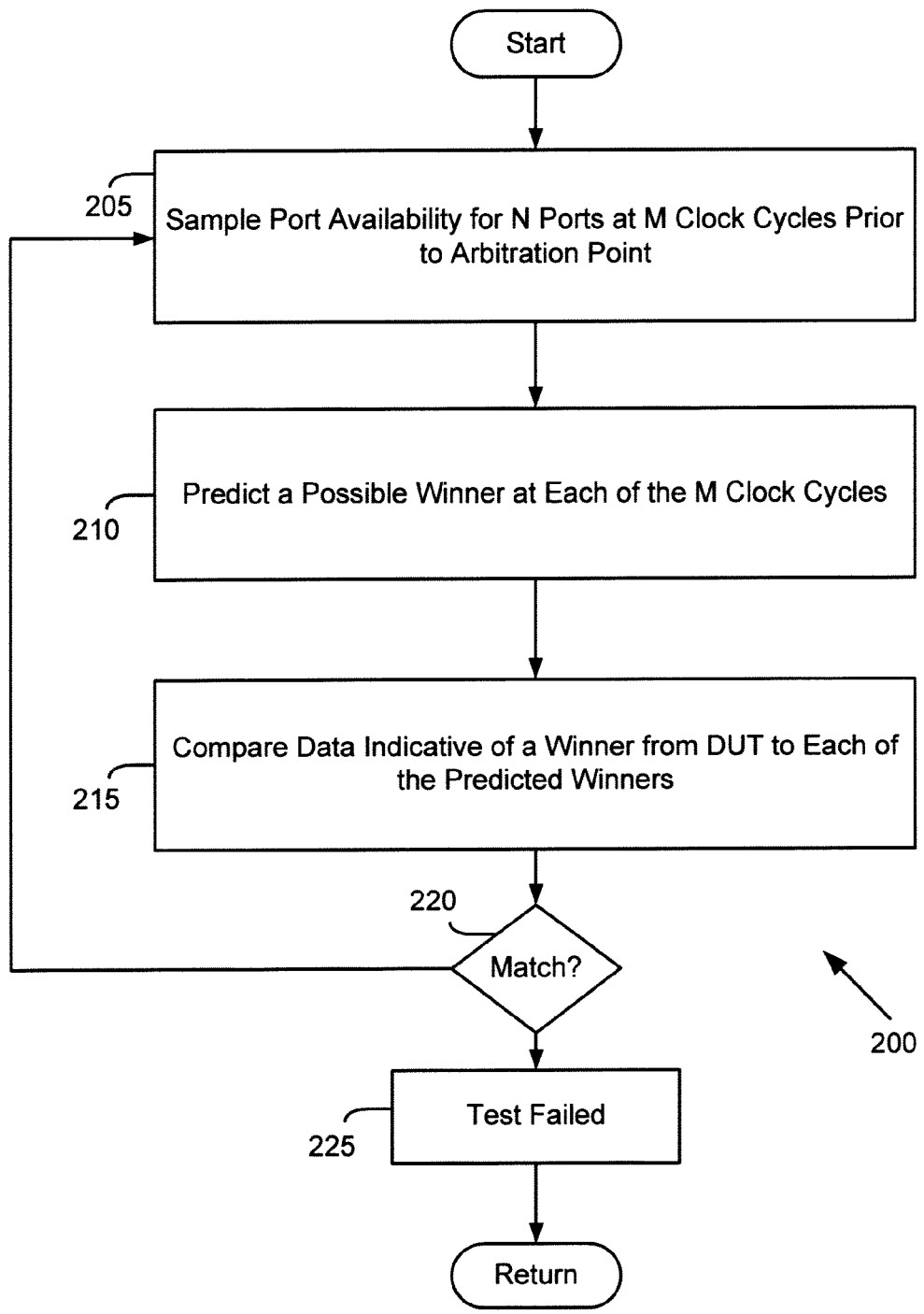
FIG. 2 is a flow diagram illustrating a process for providing port arbitration verification for a design under test according to one embodiment.

FIG. 2 shows a process 200 executed by arbitration verification system 104B for verifying arbitration logic 136A (or any other arbitration logic) in one embodiment. Referring to FIG. 2, in block 205, the process first samples port availability for certain number of ports (for example, N) of DUT 122 prior to an arbitration point. As an example, the sampling occurs a certain number of clock cycles (M) prior to the arbitration point. The arbitration point in this context is when arbitration logic 136A arbitrates between different ports to select one of the frames received at one of the plurality of ports 140A-140 D. Test data may be generated via simulator 104A and supplied to DUT 122 and arbitration verification system 104B. A snapshot may be taken at each clock cycle prior to the arbitration point. In each snapshot, the number of frames received at each port (e.g., 140) of DUT 122 is counted. In some embodiments, the snapshot at each of the clock cycles may be stored in memory (144, FIG. 1D) for later processing.

At block 210, the arbitration module 142 predicts a possible winner for each of the M clock cycles prior to the actual arbitration. In some embodiments, the arbitration module 142 may select a possible winner based on strict priority. For example, in a device having four ports (P0, P1, P2, and P3 (140A-140D), where P3 has the highest priority and P0 has the lowest priority, a winner may be selected based on the highest priority port with a frame available and bandwidth to send data. In some embodiments, the possible winner may be selected based on round robin, or deficit weighted round robin protocols as used by the arbitration logic 136a of DUT 122. Each of the possible winners may serve as a prediction for an arbitration winner for DUT 122 at the arbitration point. The possible winner information is stored at state_queue 146, as described above.

At block 215, compare module 154 (FIG. 1D) compares data 148 indicative of a winner from DUT 122 to each of the predicted winners from the state_queue 146. At the arbitration point, the process determines an arbitration winner for a DUT 122 and may announce the DUT 122 winner. The process compares the DUT 122 arbitration winner with each predicted winner selected.

At block 220, the process determines whether there is a match between the data indicative of a winner from the DUT 122 and one of the predicted winners. The process checks whether at least one of the predicted arbitration winners matches the DUT 122 arbitration winner at the arbitration point.

If a match is determined, at block 205, the process may determine that the arbitration verification test is passed. In some embodiments, the arbitration verification test may be repeated. On the other hand, if none of the predicted winners is a match, at block 225, the process indicates that the arbitration verification test failed. In some embodiments, the process may further display a verification result on a display 24. Thereafter, the process returns to block B205 to repeat the process blocks.

Figure 3A:
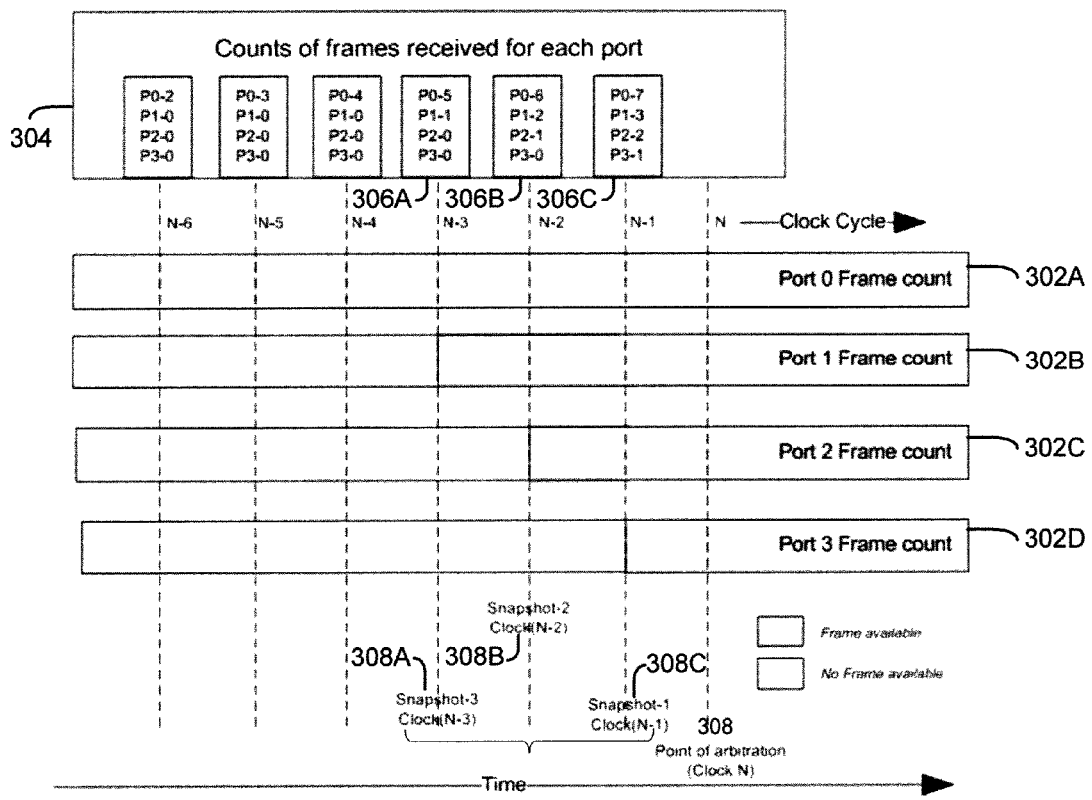
FIG. 3A is an exemplary timing diagram illustration port availability according to one embodiment.

FIG. 3A shows a timing diagram for port availability that may be used for verifying arbitration logic 136A, according to one embodiment. As shown in FIG. 3A, a frame count is maintained for each of four ports, Port 0 (140A), Port 1 (140B), Port 2 (140C) and Port 3 (140D). The frame count over time for each port is represented as 302A, 302B, 302C, and 302D, respectively. A number of frames that are available at each port are counted at different clock cycles prior to a point of arbitration at clock N 308. The frame count at each clock cycle is shown in element 304. At clock cycle N−6, P0 has received two frames while ports P1, P2 and P3 have received no frames. At N−5, port P0 has received three frames while ports P1, P2 and P3 have received no frames. At N−4, port P0 has received four frames while ports P1, P2 and P3 have received no frames. At N−3, port P0 has received five frames, P1 has received 1 frame while ports P2 and P3 have received no frames. At N−2, port P0 has received six frames, port P1 has received two, port P2 has received one frame and port P3 has received no frames. At N−1, port P0 has received seven frames, port P1 has received three, port P2 has received two frames and P3 has received one frame.

A snapshot of the frame availability for each of the ports 302 may be taken at certain clock cycles prior to the point of arbitration 308. As shown in FIG. 3A, three snapshots (308A, 308B, 308C) are taken. However, the number of snapshots taken is merely exemplary, and any number of snapshots may alternatively be taken.

Figure 3B:
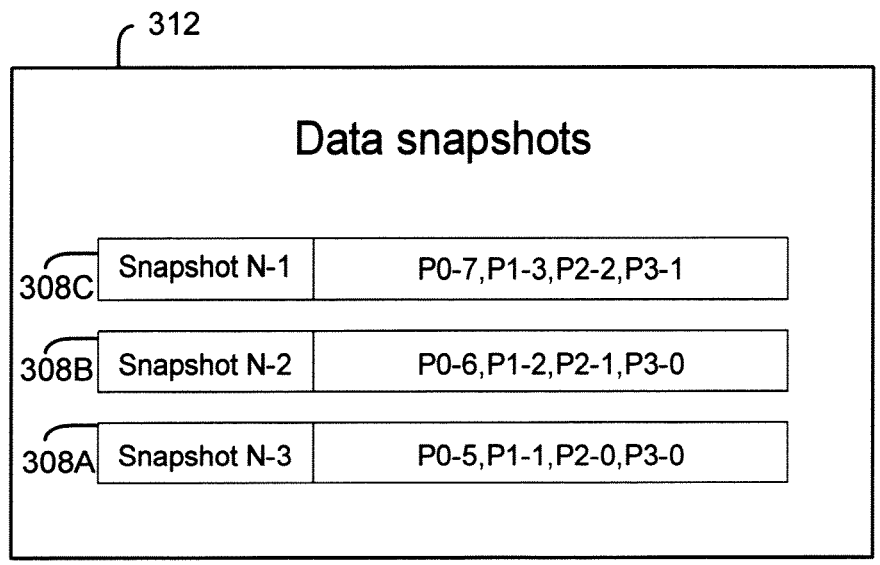
FIG. 3B illustrates a block listing data snapshots as determined in FIG. 3A.

FIG. 3B illustrates data snapshots as determined in FIG. 3A. As shown in FIG. 3B, block 312 includes the three snapshots 308A, 308B and 308C. Each of the snapshots may be provided to the arbitration verification system 104B one by one to predict a possible winner for each snapshot based on the chosen arbitration algorithm. In some embodiments, the possible winner may be selected based priority. In some embodiments, the possible winner may be selected based on a round robin selection scheme.

Figure 3C:
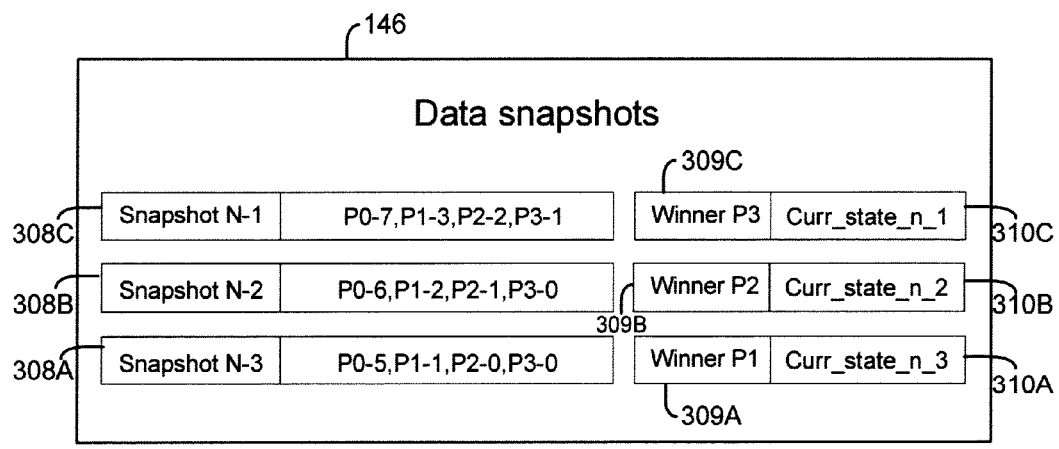
FIG. 3C, illustrates a block listing the predicted winners for each of the snapshots of FIGS. 3A and 3B.

FIG. 3C, illustrates the state_queue 146 listing the predicted winners using the snapshots of FIGS. 3A and 3B. In one embodiment, state_queue 146 may be an array that stores N elements. Each element shows an entry for a snapshot (146A, for example, 308A-308C) at a particular time with information regarding the snapshot (146B), a predicted winner (146C for example 309A-309C) and a current state (146D for example, 310A-310C).

As an example, the predicted winner for snapshot N−1 (308C) is P3 (309C) with a current state 310C. Likewise, for snapshots, N−2 (308B) and N−3 (308A), the predicted winner is respectively listed as port P2 (309B) and port P1 (309A) with current states 310B and 310A, respectively. The predicted winners are then used by arbitration verification system 104B to verify arbitration logic, as described below in detail.

When a port arbitration winner is determined by a DUT, the port arbitration winner may be compared to each of the predicted winners (309A, 309B, 309C). If any of the predicted winners matches the DUT arbitration winner, the port arbitration verification test may be considered passed. In some embodiments, the matching predicted winner may be used to update the arbitration algorithm and to predict subsequent arbitration winners. Conversely, if none of the predicted winners matches the DUT arbitration winner, the port arbitration verification test may be considered failed.

Figure 4:
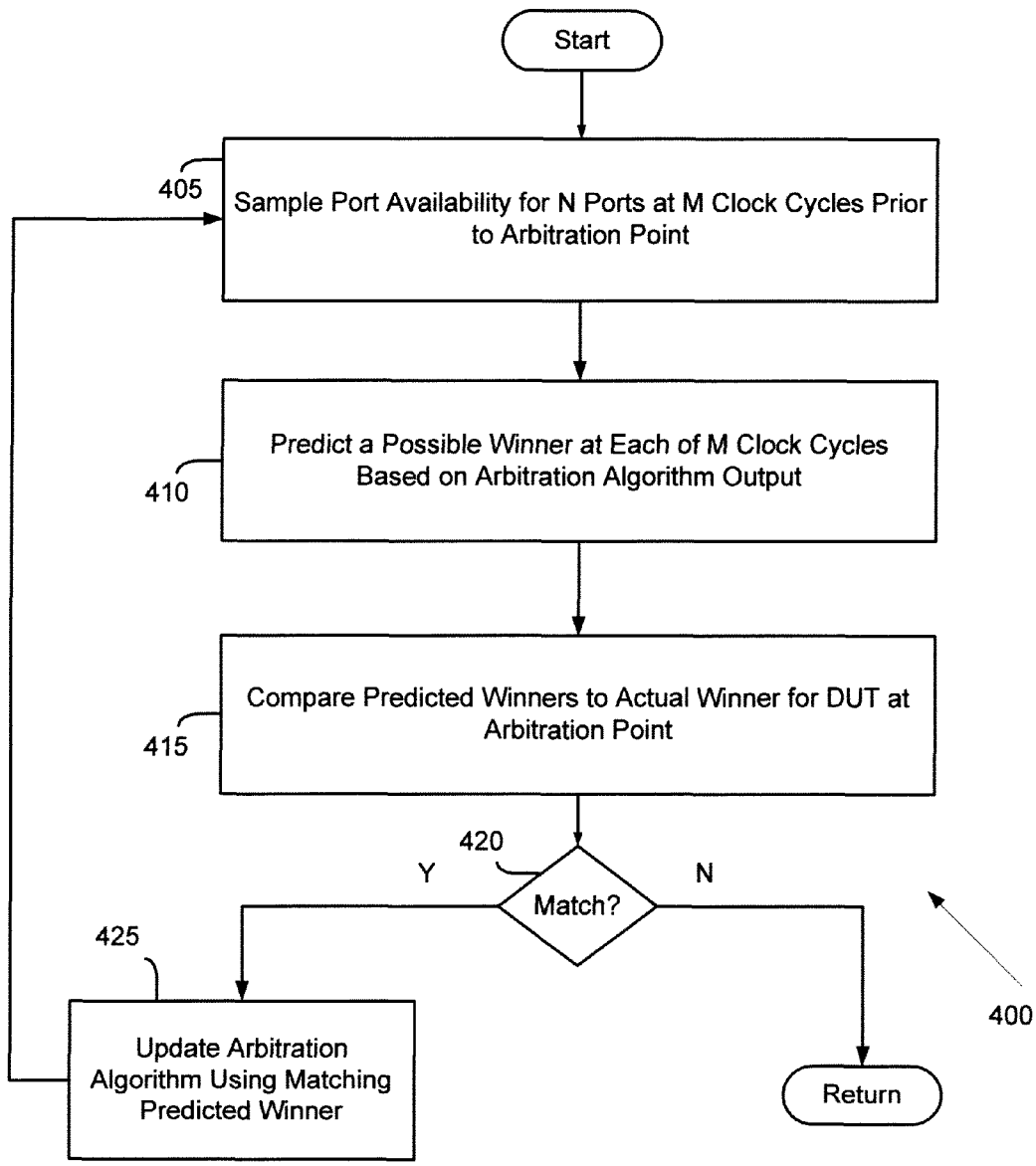
FIG. 4 is a flow diagram illustrating a process for providing port arbitration verification for a design under test according to one embodiment.

FIG. 4 is a flow diagram illustrating a process 400 executed by the arbitration verification system 104B for updating an arbitration verification program in accordance with aspects of the present disclosure. At block 405, the process samples port availability for N ports of DUT 122 at M clock cycles prior to an arbitration point (for example, 308, FIGS. 3A-3C). A snapshot (144, FIG. 1D) may be taken at each clock cycle prior to the arbitration point as described above. In each snapshot, the number of frames received at each port (e.g., 140) is counted. In addition, the snapshot may include current port credit and current port bandwidth information, for example.

In some embodiments, the arbitration verification system 104B maintains the frame available queue (also referred to as a frame_avl_queue) 150 as described above with respect to FIG. 1D. The frame_avl_queue 150 may be updated when a new frame arrives. In some embodiments, when a number of stored entries in the frame_avl_queue reach a threshold, the oldest entries may be removed to ensure space for storage of new entries.

At block 410, the process predicts a possible winner at each of the M clock cycles based on an arbitration algorithm. In some embodiments, the process may select a possible winner based on strict priority. For example, in a device having four ports (P0, P1, P2, and P3), where P3 has the highest priority and P0 has the lowest priority, a winner may be selected based on the highest priority port with a frame available and bandwidth to send data. In some embodiments, the possible winner may be selected based on round robin, or deficit weighted round robin protocols. Each of the possible winners may serve as a prediction for an arbitration winner for a DUT 122 at the arbitration point. In some embodiments, the predicted winners may be stored in a state_queue 146, described above. Each of the predicted winners may be stored in the state_queue and indexed as a current state for a clock cycle, as described above with respect to FIG. 3C.

At block 415, the process compares predicted winners to an actual winner for a DUT 122 at the arbitration point. At the arbitration point, the DUT announces an arbitration winner. The process compares the DUT arbitration winner to each of the entries of the state_queue (310A, 310B and 310C).

At block 420, the process (for example, compare module 154) determines if any of the predicted winners matches the actual winner for the DUT 122. If there is a match, at block 425, the process updates the arbitration algorithm using the matching predicted winner. The process may update the current state with the matching predicted arbitration winner. The index for a matching entry may be retrieved and then used to set a base state variable to matching current state entry of the state_queue 146. The base state may then be input to the arbitration verification algorithm for prediction of subsequent arbitration winners. Thereafter, the process may be repeated as desired.

On the other hand, if there is no match, the algorithm may be maintained. In some embodiments, an arbitration verification test failed may also be indicated. Thereafter, the process returns.

Figure 5:
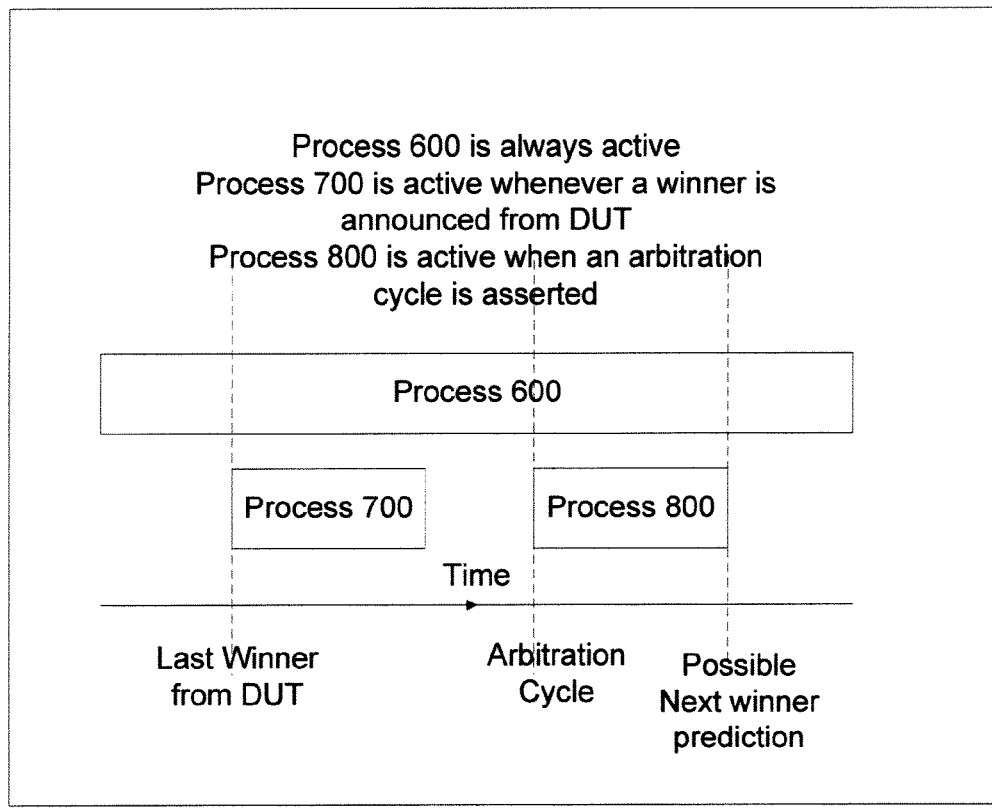
FIG. 5 shows the relationship between various processes executed by the arbitration verification system, according to one embodiment.

FIG. 5 shows a relationship 500 between three processes, 600 (FIG. 6), 700 (FIG. 7) and 800 (FIG. 8), according to one embodiment. Process 600 is always active, process 700 becomes active when a winner is announced by the DUT and process 800 becomes active when an arbitration cycle is asserted. The various processes are described below in detail.

Figure 6:
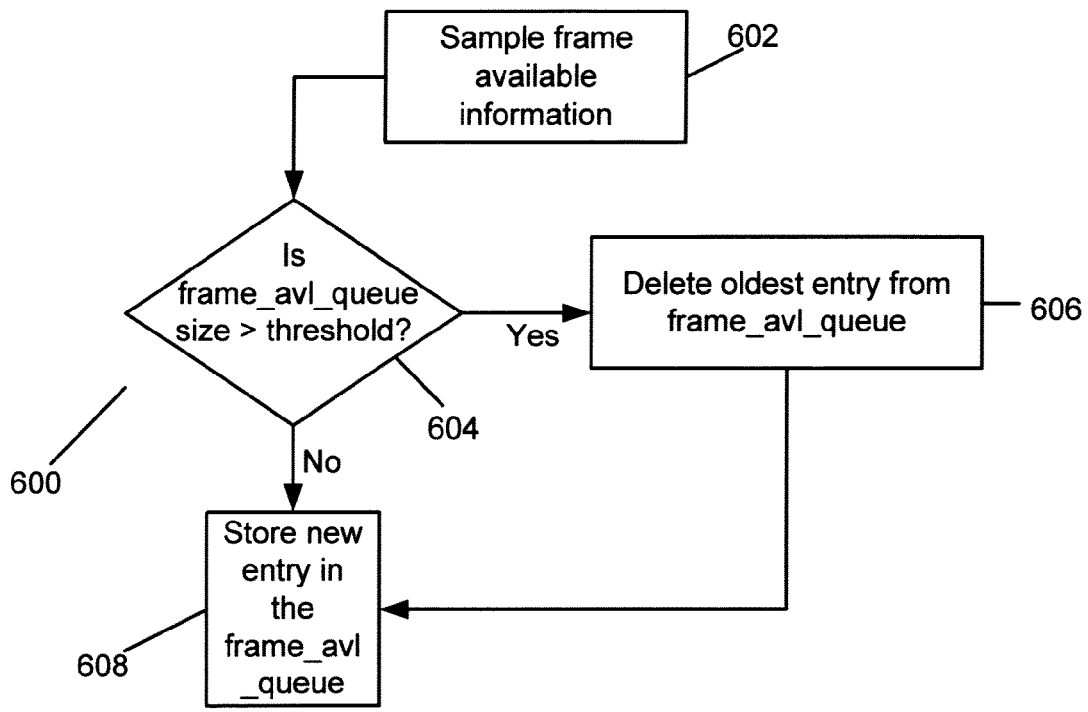
FIGS. 6-8 show various processes executed by the arbitration verification system, according to one embodiment.

FIG. 6 shows process 600, according to one embodiment. In block 602, the monitoring module 152 samples the frame_avl_queue 150 to determine if there is a new entry. When a frame is available, monitoring module 150 (FIG. 1D) determines if the frame_avl_queue 150 has reached a programmable threshold value in block 604. The threshold value may be set by a user or hardwired. If the threshold value has been reached, then in block 606, the oldest entry is deleted from the queue. If the threshold value has not been reached, then the new entry is added to the frame_avl_queue 150 in block 608.

Figure 7:
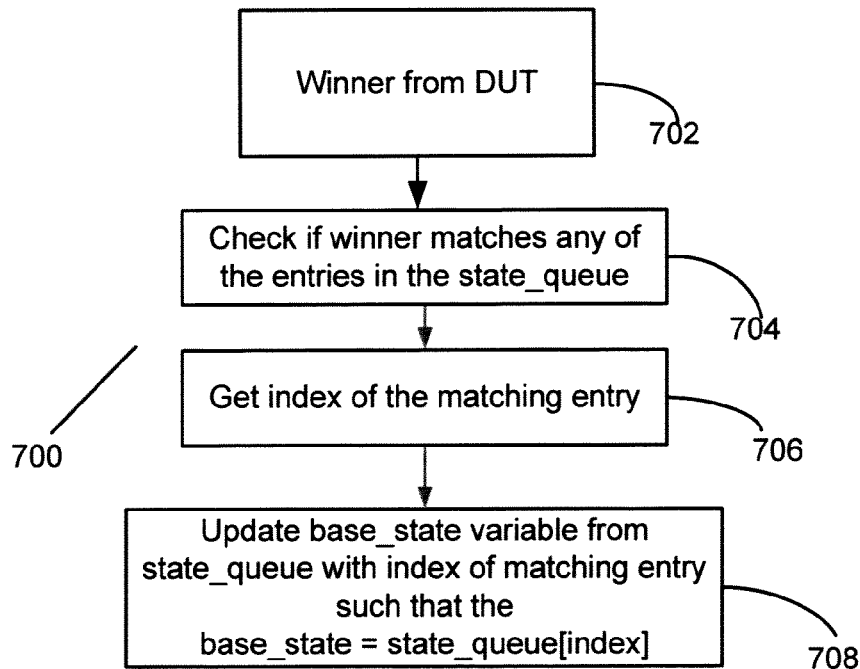

FIG. 7 shows the process 700 for managing the state_queue 146, according to one embodiment. The process waits until an actual arbitration winner is announced by DUT 122 in block 702. In block 704, the process matches the winner with any of the probable winners in the state_queue 146 (See FIG. 3C).

As described above, the state_queue 146 may be a storage array having N elements, where each element represents a probable winner. If there is a match, then the index of the matching entry is obtained in block B706. In one embodiment, the index of the matching entry is the position of the matching entry in the state_queue 146. Thereafter, in block 708, the base_state of the system is updated to the current state of the matching entry for the winner from the state_queue 146 using the index obtained from block 706. For the next arbitration cycle to predict a winner, the base state of the matching entry is used as the current state. The arbitration cycle for predicting a winner is described below in detail with respect to FIG. 8.

Figure 8:
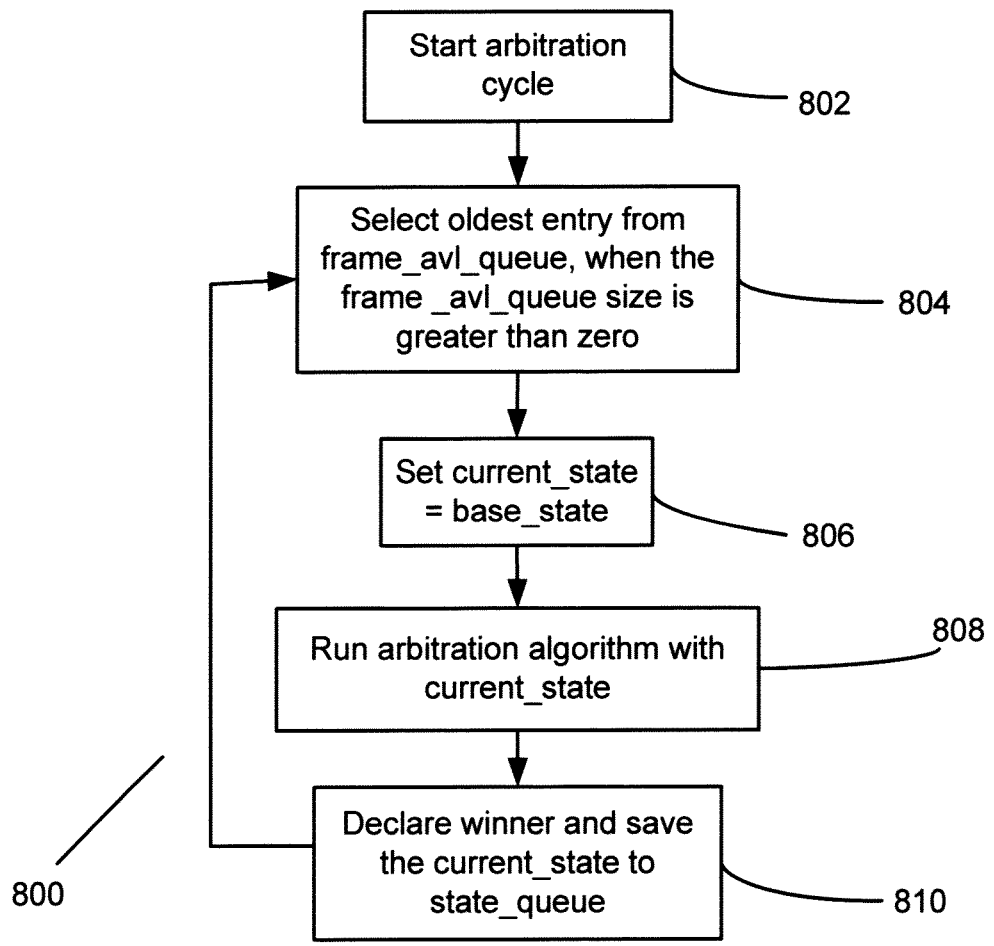

FIG. 8 shows the process 800 for an arbitration cycle for predicting a winner, according to one embodiment. The arbitration cycle starts in block 802. In block 804, the oldest entry from the frame_avl_queue 150 is selected. In block B806, the current_state of the selected entry is set as a base_state. In block 808, the arbitration process is run using the current_state. A winner is announced in block 810 and then the current_state of the entry is saved in the state_queue 146. The process blocks 804-810 are repeated in a loop, until the frame_avl_queue 150 size reaches a value of zero.

Accordingly, when compared to the conventional approaches, the techniques of the present embodiment advantageously may be used to verify any complex arbitration logic in ASIC design. By predicting winners and comparing them to the actual winners, one is able to verify any arbitration scheme that may be used in an ASIC.

The above description presents the best mode contemplated for carrying out the present embodiments, and of the manner and process of making and using them, in such full, clear, concise, and exact terms as to enable any person skilled in the art to which they pertain to make and use these embodiments. These embodiments are, however, susceptible to modifications and alternate constructions from that discussed above that are fully equivalent. Consequently, these embodiments are not limited to the particular embodiments disclosed. On the contrary, these embodiments cover all modifications and alternate constructions coming within the spirit and scope of the embodiments as generally expressed by the following claims, which particularly point out and distinctly claim the subject matter of the embodiments.

What is claimed is:

1. A machine-implemented method for providing arbitration verification, the method comprising:
   sampling port availability information for a plurality of ports of a network application specific integrated circuit (ASIC) at at least one clock cycle in advance of an arbitration point;
   determining a predicted arbitration winner for each of the at least one clock cycle in advance of the arbitration point, based in part on the port availability information, wherein the predicted arbitration winner identifies one of the plurality of ports to gain access to the ASIC;
   comparing each predicted arbitration winner to an actual arbitration winner selected by a design under test (DUT) comprising the network ASIC at the arbitration point;
   determining a verification fail unless the arbitration winner matches at least one predicted arbitration winner.

2. The method of claim 1, wherein a predicted arbitration winner is determined based on priority.

3. The method of claim 1, wherein a predicted arbitration winner is determined based on a round robin protocol.

4. The method of claim 1, wherein a predicted arbitration winner is determined based on a weighted round robin protocol.

5. A machine-implemented method for providing arbitration verification, the method comprising:
- sampling port availability information for a plurality of ports of a network ASIC at least one clock cycle in advance of an arbitration point;
- determining a predicted arbitration winner for each of the at least one clock cycle in advance of the arbitration point, based in part on the port availability information, wherein the predicted arbitration winner identifies one of the plurality of ports to gain access to the ASIC;
- comparing each predicted arbitration winner to an actual arbitration winner selected by a design under test comprising the network ASIC at the arbitration point;
- updating a reference model based on a matching predicted arbitration winner when the actual arbitration winner matches a predicted arbitration winner.

6. The method of claim 5, wherein a predicted arbitration winner is determined for a plurality of clock cycles prior to the arbitration point.

7. The method of claim 5, wherein a predicted arbitration winner is determined based on priority.

8. The method of claim 5, wherein a predicted arbitration winner is determined based on port bandwidth.

9. The method of claim 5, wherein a predicted arbitration winner is determined based on a round robin protocol.

10. A machine-implemented method for providing arbitration verification, the method comprising:
- sampling port availability information for a plurality of ports of a network ASIC at a plurality of clock cycles in advance of an arbitration point;
- determining a predicted arbitration winner for each of the plurality of clock cycles in advance of the arbitration point, based in part on the port availability information, wherein the predicted arbitration winner identifies one of the plurality of ports to gain access to the ASIC;
- comparing each predicted arbitration winner to an actual arbitration winner selected by a design under test (DUT) comprising the network ASIC at the arbitration point;
- determining a verification fail unless the arbitration winner matches at least one predicted arbitration winner.

11. The method of claim 10, wherein a predicted arbitration winner is determined based on priority.

12. The method of claim 10, wherein a predicted arbitration winner is determined based on port bandwidth.

13. The method of claim 10, wherein a predicted arbitration winner is determined based on a round robin protocol.

14. A system for providing arbitration verification, comprising:
- an arbitration verification system executed by a computing system for verifying arbitration used by a design under test;
- wherein the arbitration verification system is configured to:
  - sample port availability information for a plurality of ports of the design under test at a plurality of clock cycles in advance of an arbitration point;
  - determine a predicted arbitration winner for each of the plurality of clock cycles in advance of the arbitration point, based in part on the port availability information, wherein the predicted arbitration winner identifies one of the plurality of ports to gain access to the ASIC;
  - compare each predicted arbitration winner to an actual arbitration winner selected by the design under test at the arbitration point; and
  - determine a verification fail unless the arbitration winner matches at least one predicted arbitration winner.

15. The system of claim 14, wherein a predicted arbitration winner is determined based on priority.

16. The system of claim 14, wherein a predicted arbitration winner is determined based on port bandwidth.

17. The system of claim 14, wherein a predicted arbitration winner is determined based on a round robin protocol.

* * * * *

UNITED STATES PATENT AND TRADEMARK OFFICE
CERTIFICATE OF CORRECTION

PATENT NO.         : 9,069,919 B1
APPLICATION NO.    : 13/654308
DATED              : June 30, 2015
INVENTOR(S)        : James It is certified that error appears in the above-identified patent and that said Letters Patent is hereby corrected as shown below:

In the specification

Column 4, line 51-52, delete "Those of to" and insert -- Those of --, therefor.

Signed and Sealed this
First Day of December, 2015

Michelle K. Lee
*Director of the United States Patent and Trademark Office*